(12) United States Patent
Lu

(10) Patent No.: US 7,098,094 B2
(45) Date of Patent: Aug. 29, 2006

(54) NISI METAL GATE STACKS USING A BORON-TRAP

(75) Inventor: Jiong-Ping Lu, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/734,768

(22) Filed: Dec. 12, 2003

(65) Prior Publication Data

US 2005/0130366 A1 Jun. 16, 2005

(51) Int. Cl.
*H01L 21/8238* (2006.01)
*H01L 21/4763* (2006.01)
*H01L 21/44* (2006.01)

(52) U.S. Cl. ............... 438/199; 438/203; 438/649; 438/655; 438/663; 438/664

(58) Field of Classification Search ........ 438/197–203, 438/581, 583, 649–664, 721, 755, 224–238
See application file for complete search history.

(56) References Cited

U.S. PATENT DOCUMENTS

| | | | | |
|---|---|---|---|---|
| 5,661,052 A | * | 8/1997 | Inoue et al. | 438/303 |
| 6,008,111 A | * | 12/1999 | Fushida et al. | 438/584 |
| 6,232,227 B1 | * | 5/2001 | Mikagi | 438/655 |
| 6,255,214 B1 | * | 7/2001 | Wieczorek et al. | 438/659 |
| 6,306,698 B1 | * | 10/2001 | Wieczorek et al. | 438/197 |
| 6,413,807 B1 | * | 7/2002 | Mikagi | 438/198 |
| 6,596,599 B1 | * | 7/2003 | Guo | 438/305 |
| 6,617,624 B1 | * | 9/2003 | Powell | 257/288 |
| 6,653,700 B1 | * | 11/2003 | Chau et al. | 257/412 |
| 6,727,165 B1 | * | 4/2004 | Puchner et al. | 438/581 |
| 6,734,099 B1 | * | 5/2004 | Zhao et al. | 438/656 |
| 6,773,978 B1 | * | 8/2004 | Besser et al. | 438/238 |

* cited by examiner

*Primary Examiner*—Maria F. Guerrero
(74) *Attorney, Agent, or Firm*—Jacqueline J. Garner; W. James Brady, III; Fredrick J. Telecky, Jr.

(57) ABSTRACT

A capping layer (118) is used during an anneal to form fully silicided NiSi gate electrodes (120). The capping layer (118) comprises a material with an affinity for boron, such as TiN. The capping layer (118) serves as a boron trap that reduces the interface boron concentration for PMOS transistors without reducing the interface arsenic concentration for NMOS transistors.

4 Claims, 6 Drawing Sheets

NISI METAL GATE STACKS USING A BORON-TRAP

FIELD OF THE INVENTION

The invention is generally related to the field of forming gate electrodes in semiconductor devices and more specifically to forming NiSi metal gates using a boron-trap.

BACKGROUND OF THE INVENTION

Metal gate electrodes are being investigated to replace polysilicon in order to solve problems of poly-depletion effects and boron penetration for future CMOS devices. Traditionally, a polysilicon gate electrode with an overlying silicide has been used for the gate electrodes in CMOS devices. However, as device feature size continues to shrink, poly depletion becomes a serious issue. Accordingly, metal gates are being proposed. However, in order to optimize $V_t$ in high-performance devices, the metal gates need tunable work functions for NMOS and PMOS devices similar to present polysilicon gate technology, requiring the work functions of metal gates ranging from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf Proc.*, pp. 91–92, 2001). Several methods have been suggested for tuning the work functions. Metal inter-diffusion gate based on diffusion between two metals during thermal reaction, yields two work function values that are strongly dependent on the metal material properties. Nitrogen implantation into a single metal has also been suggested to tune the work functions.

Recently, fully silicided metal gates have been demonstrated based on the extension of existing self-aligned silicide (SALICIDE) technology. In this approach, polysilicon is deposited over the gate dielectric. Ni is deposited over the polysilicon and reacted to completely consume the polysilicon resulting in a fully silicided metal gate rather than a deposited metal gate. The fully silicided metal gate provides a metal gate with the least perturbation to the conventional process and avoids contamination issues. Furthermore, poly doping has been shown to affect the work function of NiSi metal gates. Methods for improving the performance of fully silicided NiSi gates are needed for CMOS applications.

SUMMARY OF THE INVENTION

The invention is an improved method for forming NiSi gate electrodes. After the polysilicon gate structures are formed, a Ni layer is deposited over the gate structures. A capping layer is deposited over the Ni and polysilicon layers. The capping layer comprises a material with an affinity for boron, such as a transition-metal-nitride. A thermal anneal is then performed to fully convert the polysilicon to NiSi. The capping layer and the unreacted Ni are then removed.

An advantage of the invention is providing a method for forming PMOS NiSi gate electrodes with improved thermal stability without negatively impacting the work function for NMOS devices.

This and other advantages will be apparent to those of ordinary skill in the art having reference to the specification in conjunction with the drawings.

DETAILED DESCRIPTION OF THE EMBODIMENTS

Figure 1:
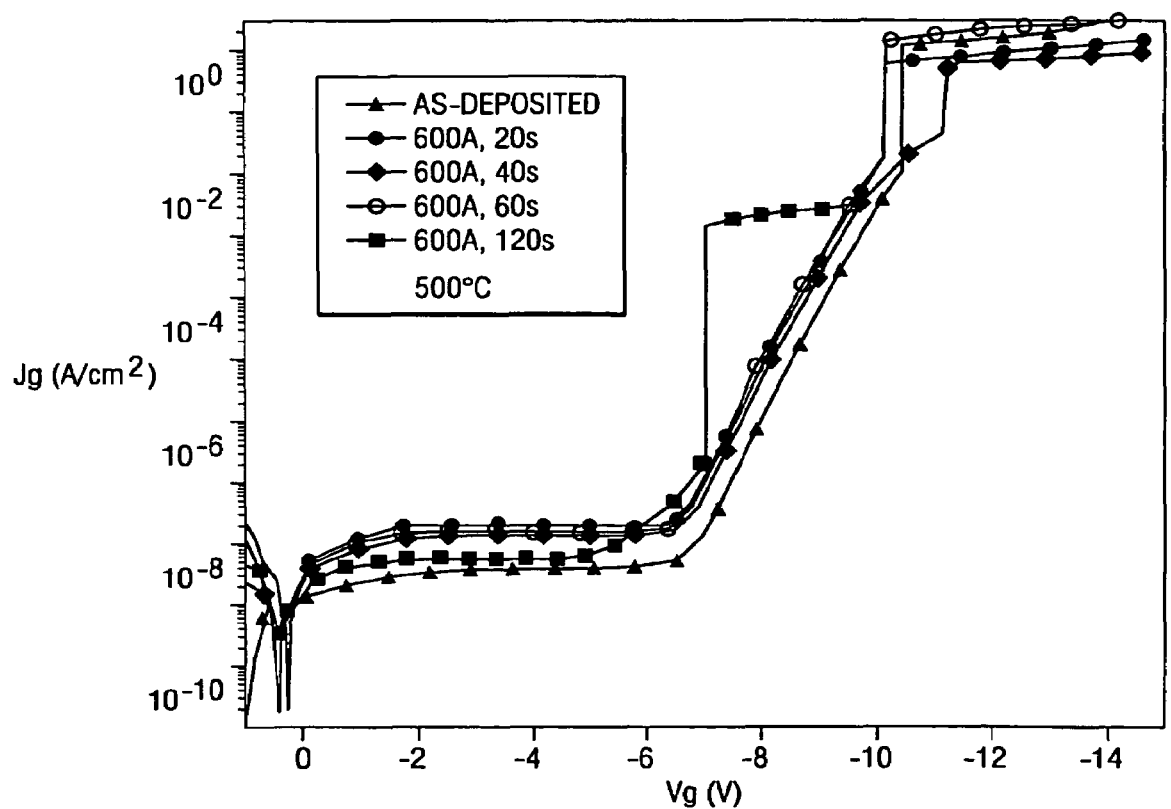
FIG. 1 is a graph of gate voltage versus current density for a b-doped poly-Ni gate as deposited and after various anneals.

A fully silicided NiSi metal gate, in which a polysilicon layer is completely consumed during Ni silicidation, has advantages over other metal gate approaches such as metal interdiffusion (or dual metal) and single metal with a N+ implant. However, preliminary tests on a fully silicided NiSi metal gate electrode showed that NiSi metal gates formed from B(boron)-doped poly result in poor thermal stability. FIG. 1 is a graph of gate voltage versus current density for a boron-doped NiSi gate. FIG. 1 shows an early breakdown voltage for a 600 Å gate annealed for 120 sec. at 500° C.

The invention uses a capping layer to trap boron within the capping layer during silicidation and therefore eliminate the adverse impact of B-dopant. After silicidation, the capping layer can be removed using, for example, a wet etch that also removes the unreacted Ni in non-gate areas. The capping layer comprises a material with high affinity for B such as transition metal-nitrides (e.g., TiN, TaN, MoN, CrN, and WN). An added advantage of the capping layer is that it keeps the arsenic (As) dopant of the NMOS gate at the NiSi-gate dielectric interface, which advantageously reduces the work function of the NMOS.

Figure 2A:
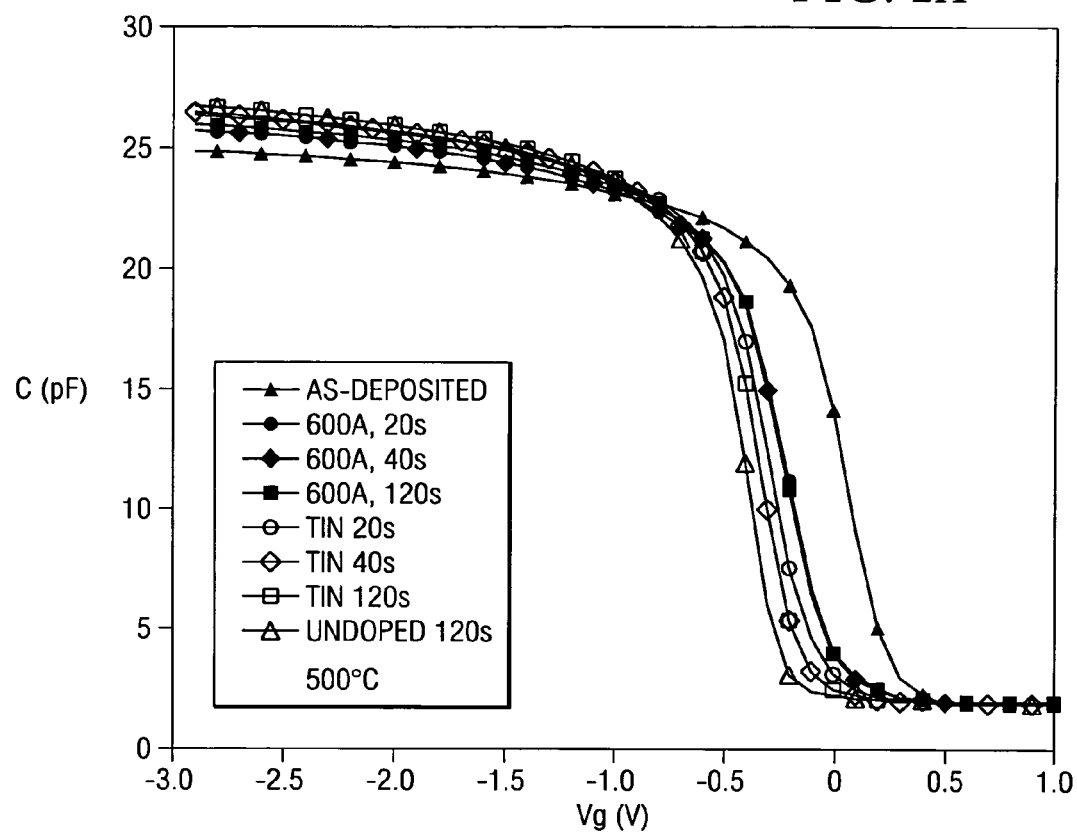
FIG. 2A is a C-V graph of an undoped NiSi gate and B-doped poly-Ni gate both with and without a TiN capping layer after various anneals.
Figure 2B:
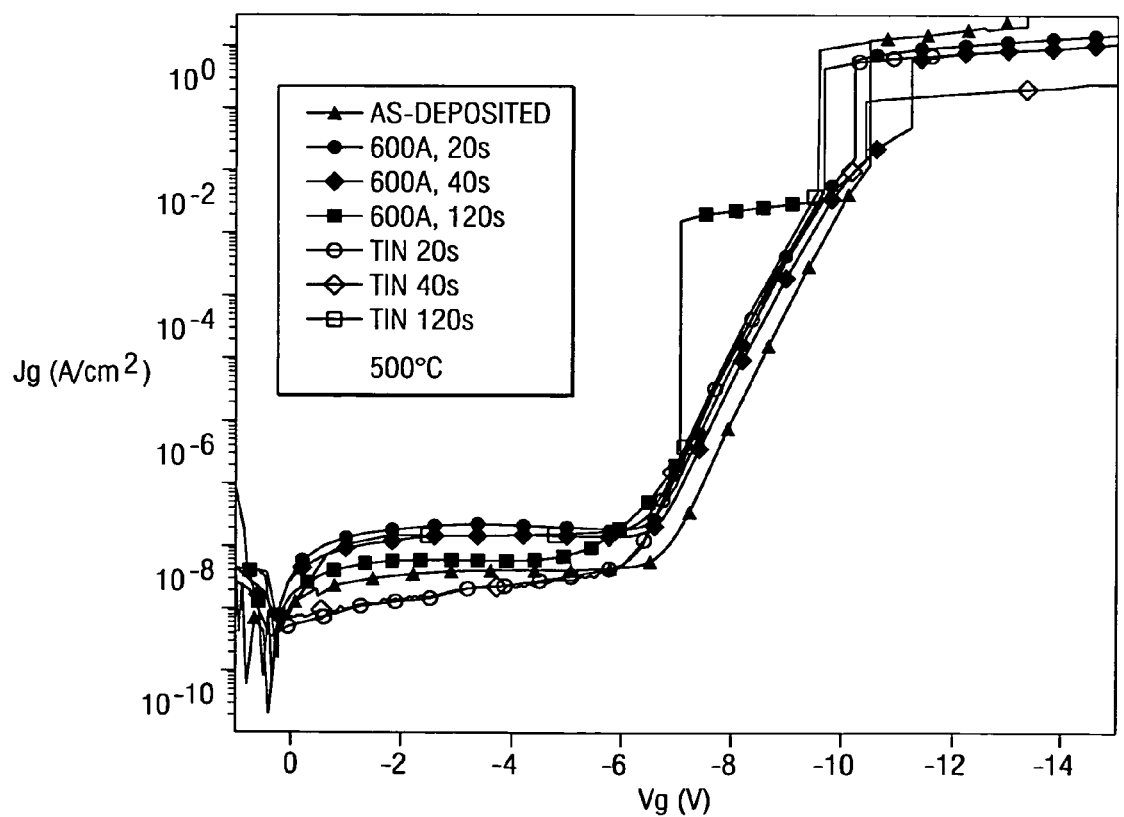
FIG. 2B is a graph of gate voltage versus current density for a B-doped poly-Ni gate as deposited and with and without a TiN capping layer after various anneals.
Figure 3A:
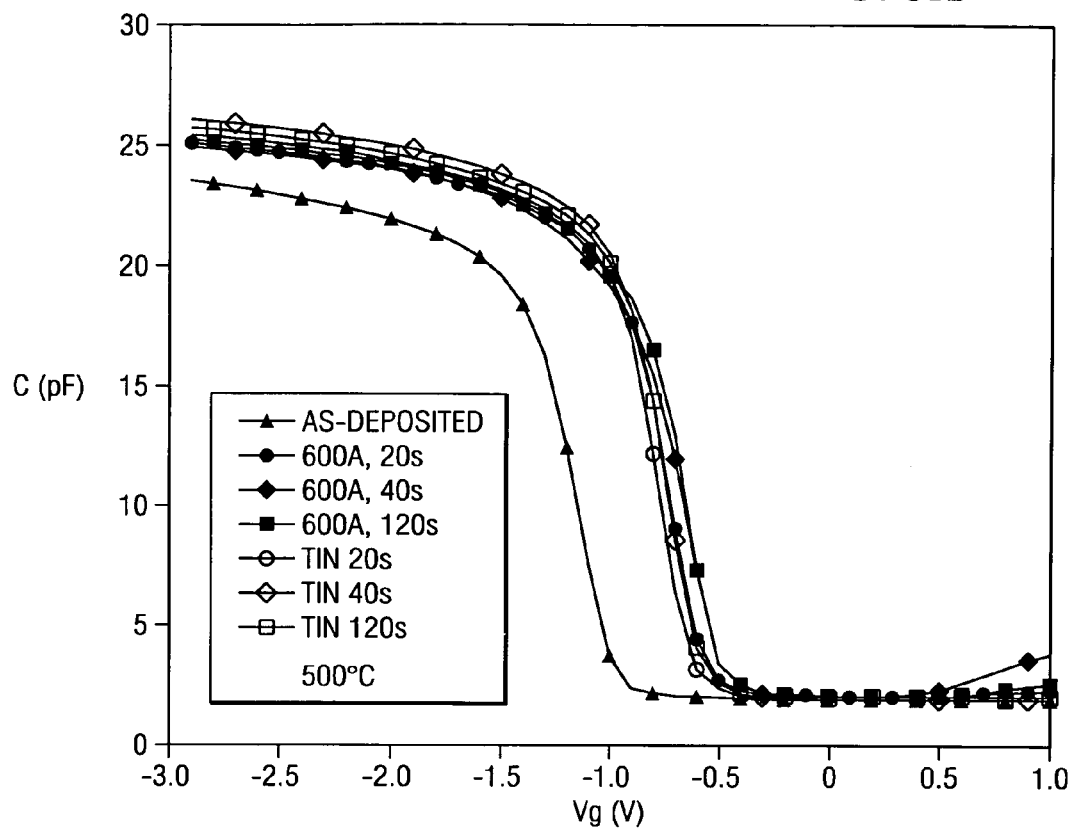
FIG. 3A is a C-V graph of an As-doped poly-Ni gate both with and without a TiN capping layer after various anneals.
Figure 3B:
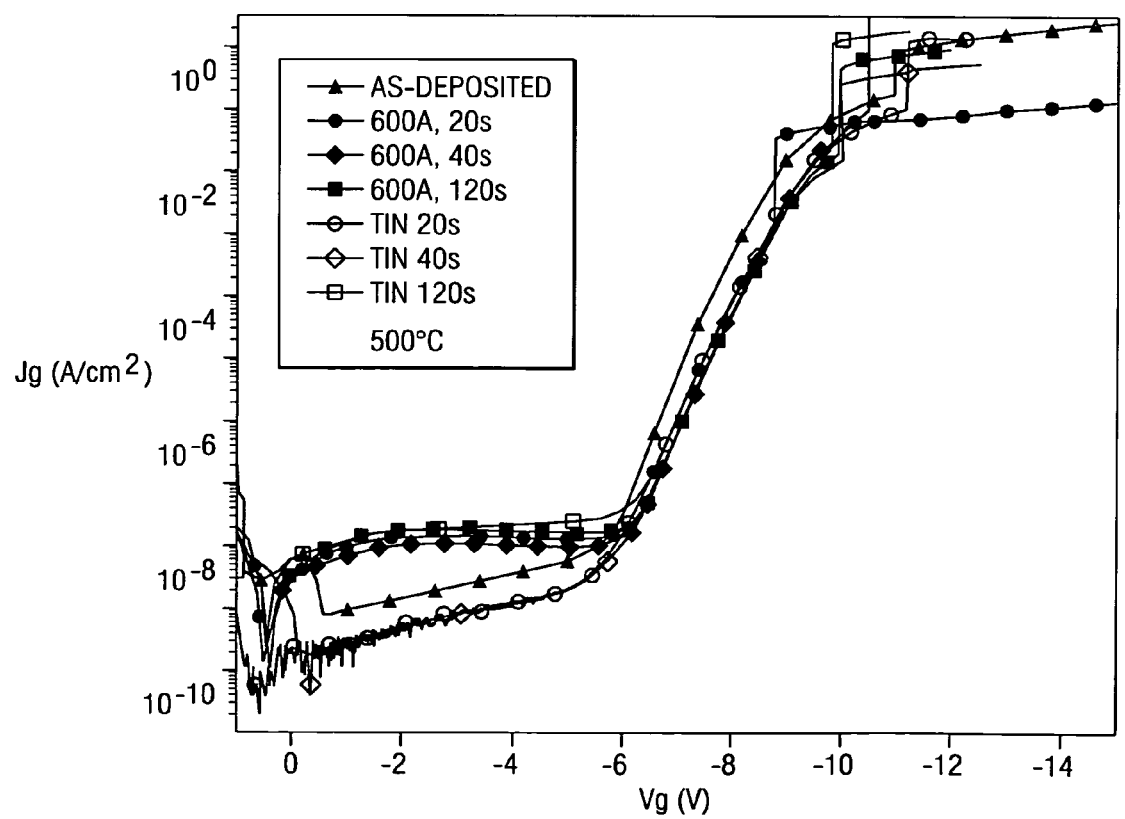
FIG. 3B is a graph of gate voltage versus current density for a As-doped poly-Ni gate as deposited and with and without a TiN capping layer after various anneals.

Preliminary tests confirmed that using a TiN capping layer effectively improves the properties of both NMOS and PMOS gates. FIG. 2A is a C-V graph for undoped poly-Ni compared to B-doped poly-Ni, both as deposited and with and without a TiN cap after 20 s, 40 s, and 120 s anneals. $V_{fb}$ shift is reduced by using a TiN cap, indicating a reduction of B at the NiSi/SiO$_2$ interface. Thus, the TiN B-trap layer is useful for tuning the workfunction of PMOS gates. FIG. 2B is a similar to FIG. 1 with additional curves for the case of a TiN cap after 20 s, 40 s, and 120 s anneals. The early breakdown problem for the 120 s anneal is solved by the use of the TiN capping layer. FIG. 3A is a C-V graph for As-doped poly-Ni, both as deposited and with and without a TiN cap after 20 s, 40 s, and 120 s anneals. There is little $V_{fb}$ shift with the TiN cap. Arsenic remains at the gate/dielectric interface and continues to provide the desired workfunction reduction. Thus, the work function of the PMOS may be tuned (due to boron redistribution) without significantly affecting the workfunction of the NMOS. FIG. 3B shows no significant impact on Vbd (breakdown voltage) between a TiN cap and no cap.

Figure 4A:
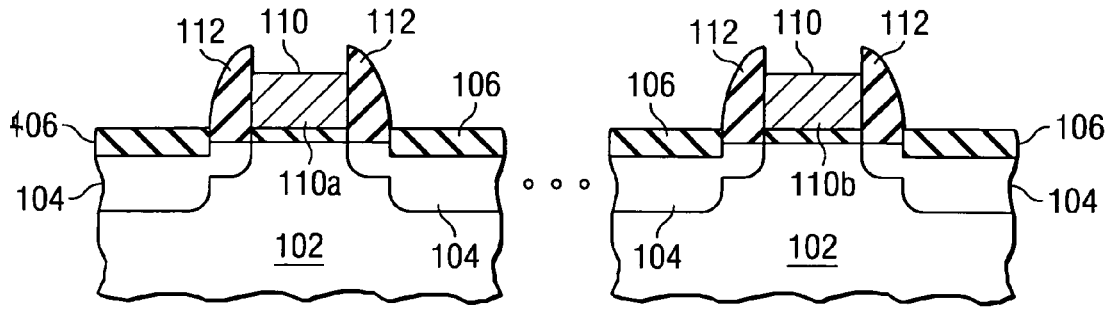
FIGS. 4A–4D are cross-sectional diagrams illustrating a NiSi gate electrode according to the invention at various steps of fabrication.

An embodiment of the invention will now be described with respect to FIGS. 4A–4D. Referring to FIG. 4A, a semiconductor body 102 is processed through the formation of source/drain regions 104. Semiconductor body 102 typically comprises a silicon substrate with or without epitaxially layers formed thereon. Suitable alternative substrates, such as silicon-on-insulator or SiGe, are known in the art. Source/drain regions 104 conventionally comprise a silicided surface 106. At this point in the process, the gate structure comprises a gate dielectric 108, a polysilicon layer 110, and sidewall spacers 112. First portions 110a of polysilicon layer 110 are doped with p-type dopant such as boron for a PMOS transistor. Second portions 110b of polysilicon layer 110 are doped with n-type dopant, such as arsenic, for a NMOS transistor. The thickness of polysilicon layer 110 is typically in the range of 500 Å–1500 Å.

Figure 4B:
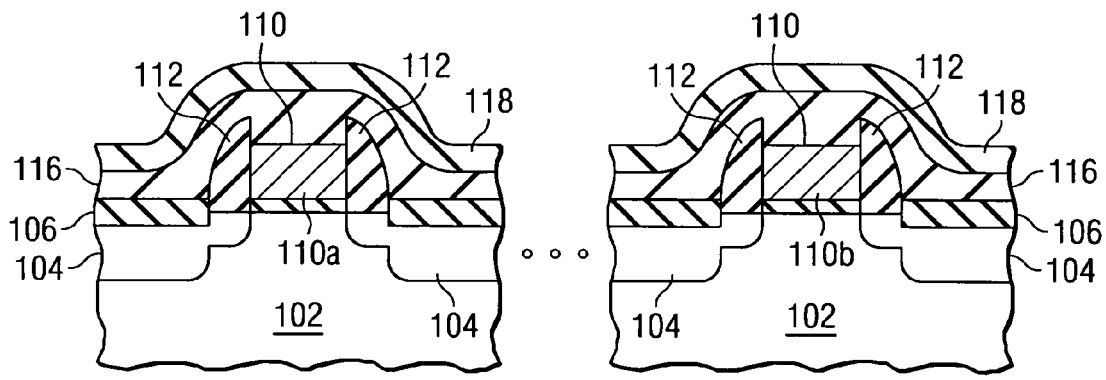

Referring to FIG. 4B, a layer of Ni 116 is deposited over the structure. Ni layer 116 may have a thickness in the range of 250 Å–1000 Å. The thickness is suitable for completely converting polysilicon layer 110 to NiSi in a subsequent anneal. A B-trap capping layer 118 is deposited over Ni 116. Capping layer 118 comprises a material with an affinity for boron, such as transition-metal-nitrides. Transition metal-nitrides include TiN, TaN, MoN, CrN, and WN. The thickness of capping layer 118 is in the range of 5 nm to 50 nm, preferably around 20 nm.

Figure 4C:
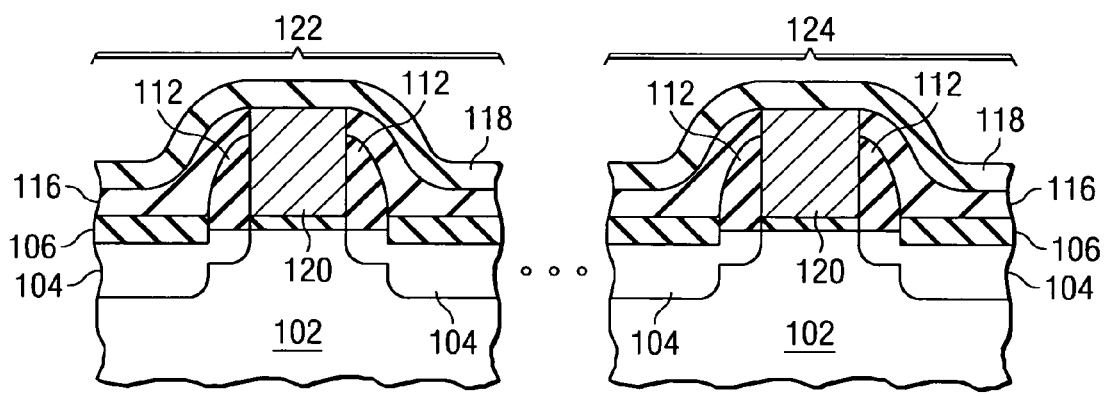

After depositing B-trap capping layer 118, the structure is annealed to convert a portion of Ni layer 116 and all of polysilicon layer 110 into NiSi layer 120, as shown in FIG. 4C. For example, a thermal anneal at a temperature in the range of 400° C.–600° C. and a duration of 20 s–120 s may be used. During the anneal, capping layer 118 attracts boron from first portion 110a of polysilicon layer 110. Thus, some of the boron dopant redistributes into capping layer 118. Arsenic from second portion 110b of polysilicon layer 110 is not attracted and thus remains at the electrode/gate dielectric interface. The workfunction of the NMOS transistor 124 remains reduced as desired for NMOS. Less modification of the workfunction is needed for PMOS transistor 122.

Figure 5A:
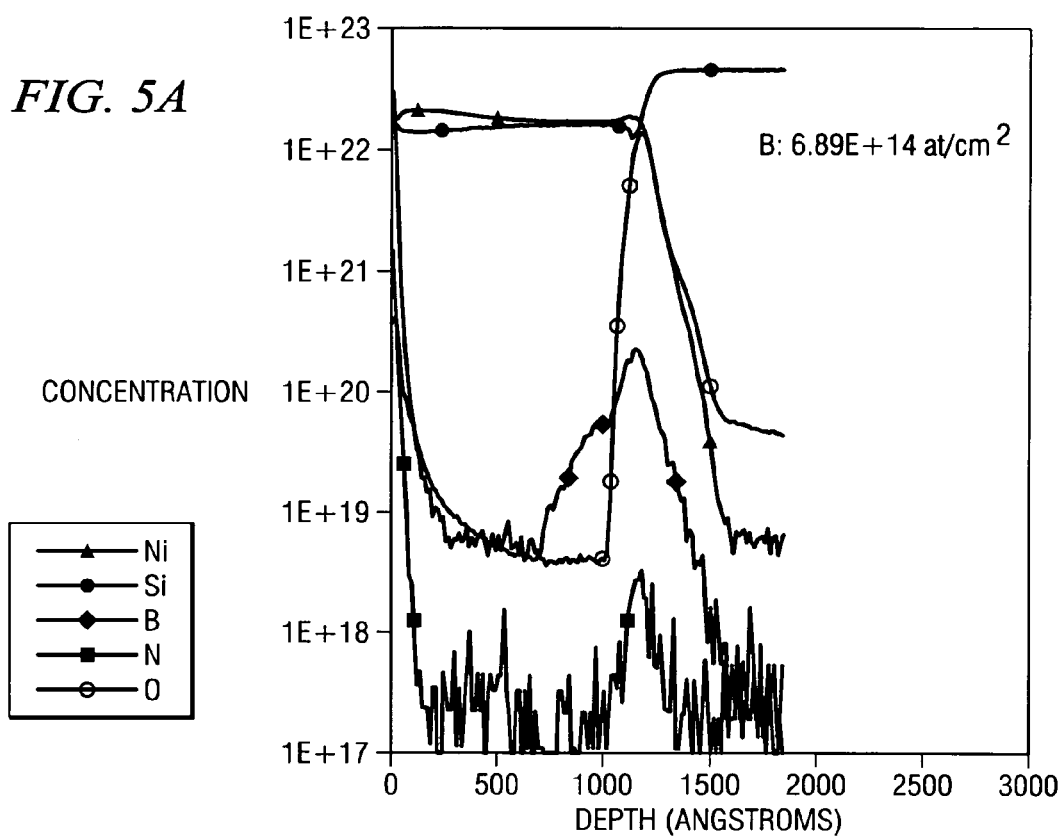
FIGS. 5A and 5B are graphs of boron distribution without and with a TiN capping layer, respectively.
Figure 5B:
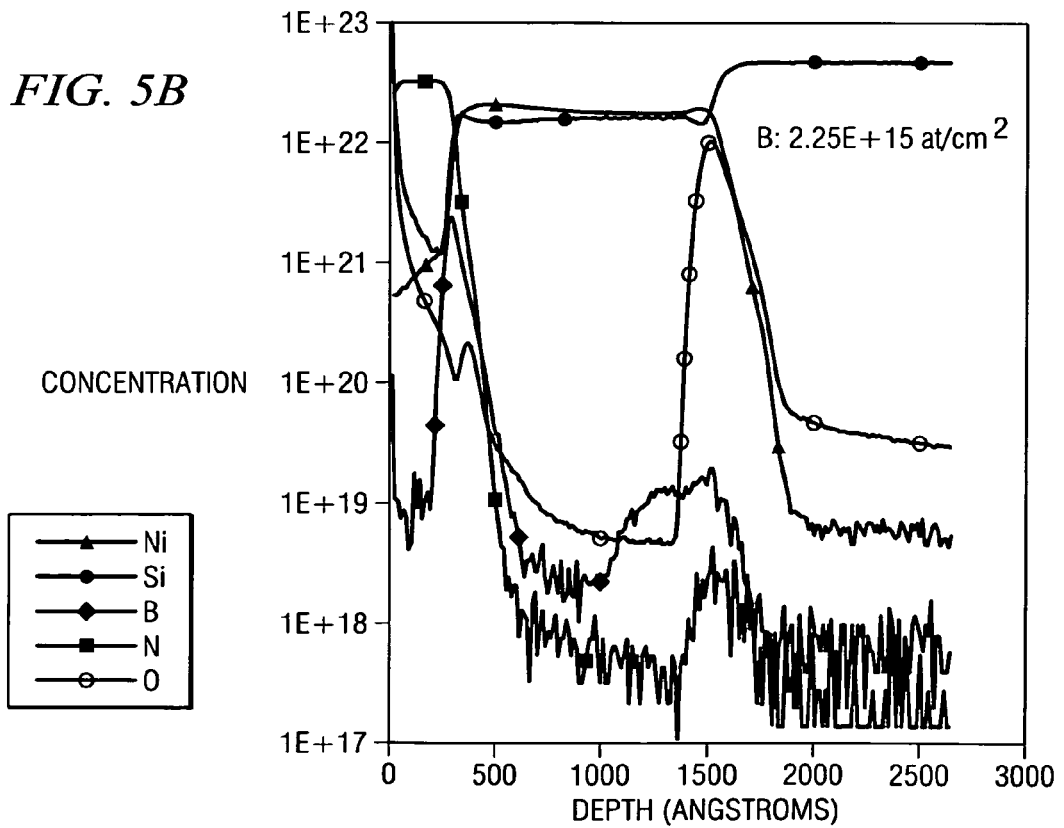

FIGS. 5A and 5B illustrate the impact of a TiN capping layer on boron distribution. FIG. 5A show the boron distribution for the case where no capping layer is present. Boron becomes concentrated at the NiSi gate electrode/gate dielectric interface. This concentration affects the workfunction, but also causes early breakdown of the transistor. FIG. 5B show the cases where a TiN B-trap is used. Boron is redistributed away from the gate electrode/dielectric interface. The TiN capping layer attracts boron so that a greater concentration of boron is found at the capping layer/NiSi interface than at the NiSi/gate dielectric interface. The workfunction is modified, but is still within the desired range. Early breakdown of the transistor is avoided.

Figure 6A:
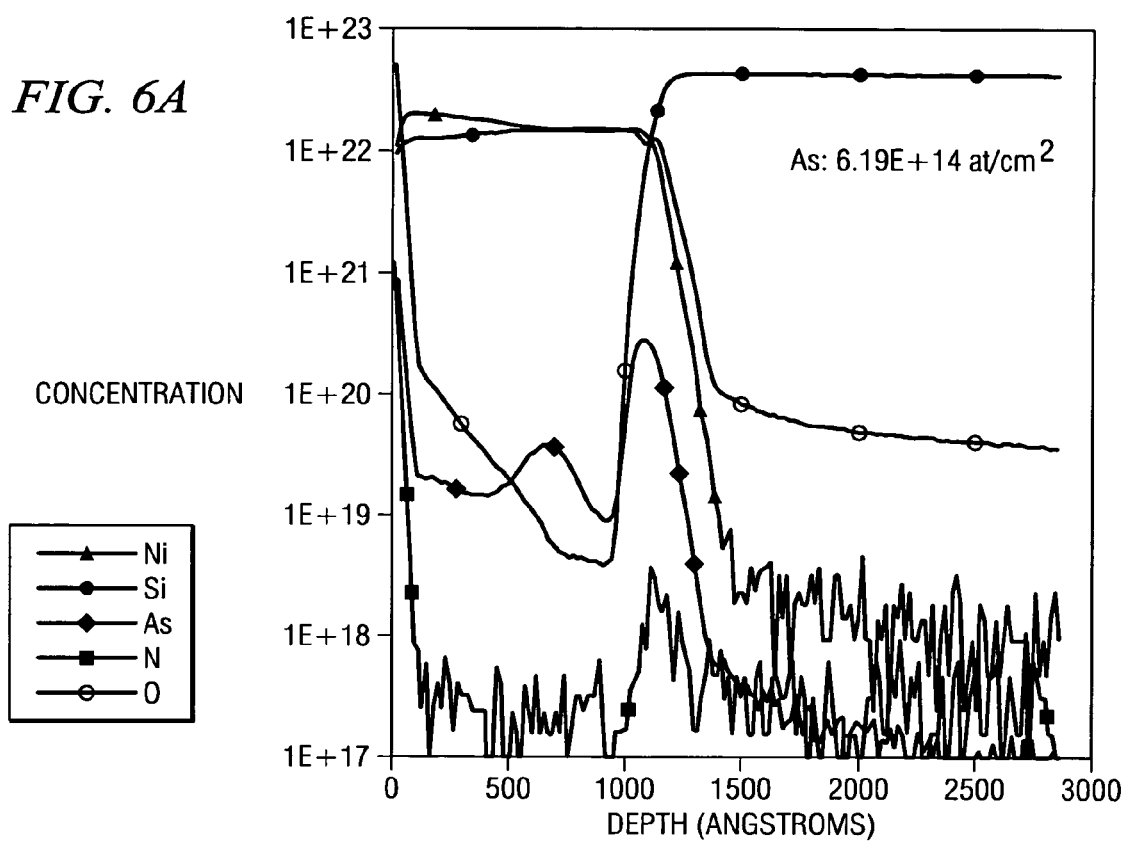
FIGS. 6A–6B are graphs of arsenic distribution without and with a TiN capping layer, respectively.
Figure 6B:
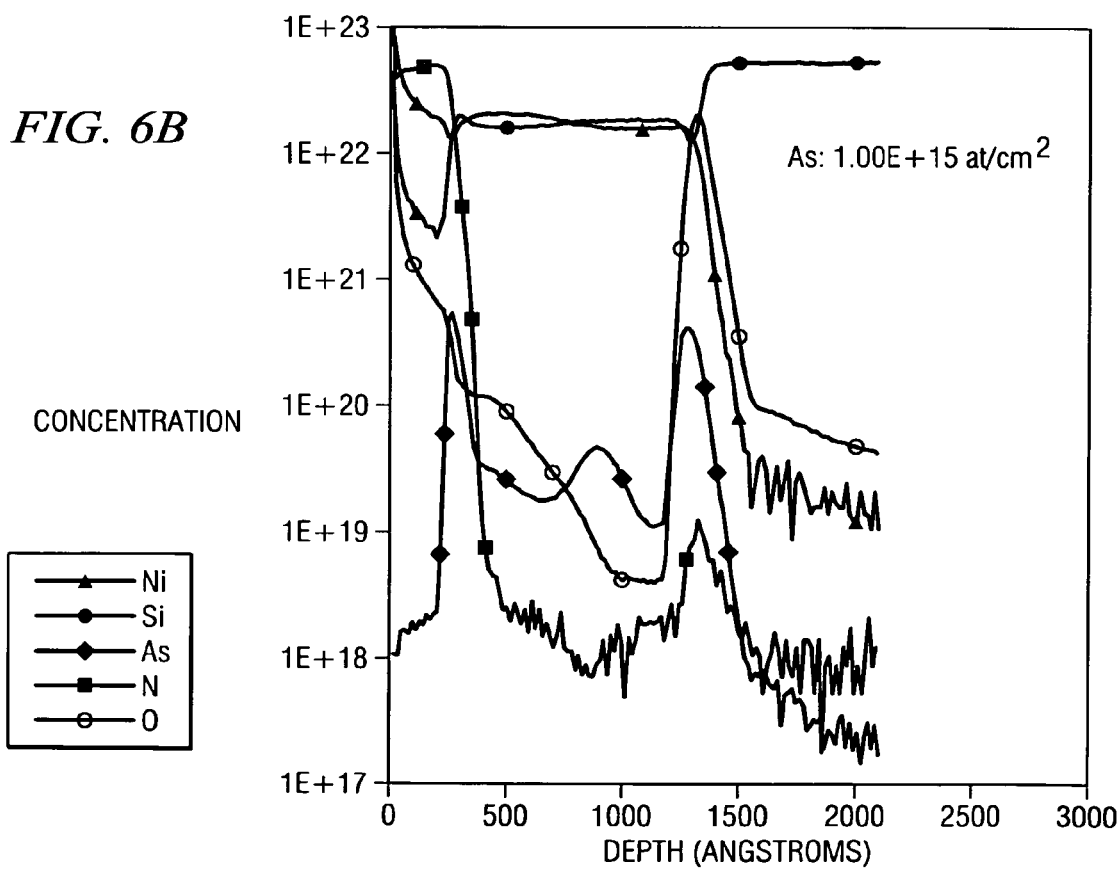

FIGS. 6A and 6B illustrate the impact of a TiN capping layer on arsenic distribution. FIG. 6A show the arsenic distribution for the case where no capping layer is present. Arsenic becomes concentrated at the NiSi gate electrode/gate dielectric interface. This concentration is desirable as it reduces the workfunction to within the desired range. FIG. 6B show the case where a TiN cap is used. In contrast to the affect on boron distribution, arsenic is not redistributed away from the gate electrode/dielectric interface. The TiN capping layer does not attract arsenic, possibly due to the size of the arsenic atoms. The concentration of arsenic remains at the NiSi/gate dielectric interface as desired for a reduction in workfunction. Thus, positive effects are seen with regard to boron redistribution without negatively impacting the arsenic distribution.

Figure 4D:
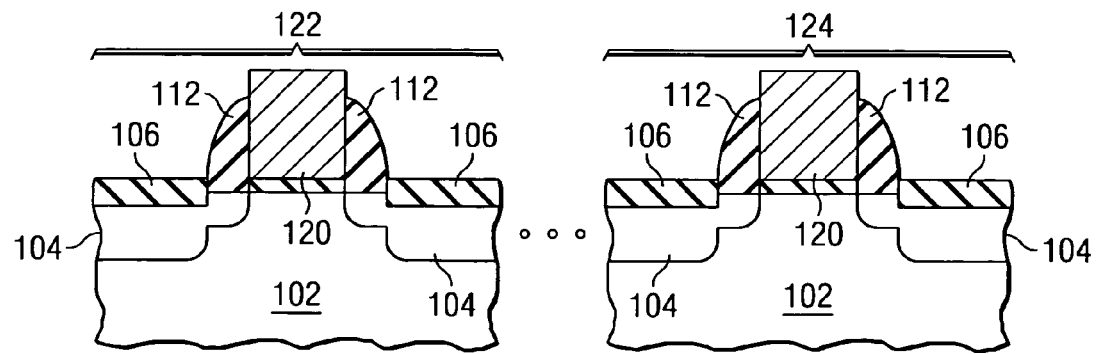

Referring to FIG. 4D, the capping layer 118 (including a portion of the boron dopant) is removed using, for example, a wet etch. The same etch can be used to also remove the unreacted portions of Ni layer 116 not overlying the gate electrode. For example, a sulfuric acid and peroxide mixture (i.e., $H_2SO_4+H_2O_2+H_2O$) may be used. Processing then continues as is known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method for fabricating an integrated circuit comprising the steps of:
    forming a plurality of CMOS polysilicon gate structures over a semiconductor body;
    forming a gate dielectric on said semiconductor body prior to forming the plurality of CMOS polysilicon gate structures such that said gate dielectric is located between said semiconductor body and said plurality of CMOS polysilicon gate structures;
    forming a layer of nickel over said semiconductor body including over said plurality of CMOS polysilicon gate structures;
    forming a capping layer over said layer of nickel, said capping layer comprising a material with an affinity for boron;
    then, annealing the semiconductor body to completely convert sold CMOS polysilicon gate structures into NiSi gate electrodes; and
    removing said capping layer and unreacted portions of said layer of nickel, wherein said capping layer attracts a significant amount of boron away from an interface with said gate dielectric in a PMOS transistor but does not attract a significant amount of arsenic away from an interface with said gate dielectric in an NMOS transistor during sold annealing step.

2. A method for fabricating an integrated circuit, comprising the steps of: providing a semiconductor body having a plurality of polysilicon gate structures formed there on, wherein a first subset of said plurality of polysilicon gate structures are doped with boron dopant and a second subset of said plurality of polysilicon gate structures are doped with arsenic dopant;
    forming a nickel layer over said semiconductor body including over said plurality of polysilicon gate structures;
    forming a capping layer over said nickel layer, said capping layer comprising a transition metal nitride with an affinity for boron;
    then, annealing the semiconductor body to completely convert said polysilicon gate structures to NiSi gate electrodes by reacting portions of said nickel layer with said polysilicon gate structures, wherein boron is redistributed during the annealing step with portion of the boron diffusing into said capping layer; and
    removing said capping layer and unreacted portions of said layer of nickel.

3. The method of claim 2, wherein said transition metal-nitride comprises TiN.

4. The method of claim 3, wherein said annealing step is performed at a temperature in the range of 400° C. to 600° C.

* * * * *